United States Patent [19]

Whitinger

[11] 4,400,809
[45] Aug. 23, 1983

[54] ARBITRARY DRIVE FOR MAGNETIC FIELD WAVEFORM CONTROL

[75] Inventor: Robert J. Whitinger, Richardson, Tex.

[73] Assignee: Texas Instruments Incorporated, Dallas, Tex.

[21] Appl. No.: 239,280

[22] Filed: Mar. 2, 1981

[51] Int. Cl.³ .................... G01R 31/28; G11C 29/00
[52] U.S. Cl. .................................. 371/27; 324/210; 365/1
[58] Field of Search ................. 371/21, 27; 365/1, 6, 365/201; 324/210, 211, 212; 364/487, 607, 579, 580, 574

[56] References Cited

U.S. PATENT DOCUMENTS

| | | | |
|---|---|---|---|
| 3,609,528 | 9/1979 | Smith | 324/211 |
| 4,008,420 | 2/1977 | Navratil | 365/6 |
| 4,233,668 | 11/1980 | Yamaguchi et al. | 365/1 |

OTHER PUBLICATIONS

Chen et al., A Novel Probe Tester for the Characterization of 1 Mbit/cm² Bubble Memory Device, J. Appl. Phys., 52 (3), Mar. 1981, pp. 2392-2394.

Hagedorn et al., Magnetic Bubble Testing, IEEE Transactions on Magnetics, vol. MAG-13, No. 5, Sep. 1977, pp. 1364-1369.

Bisset et al., Bubble Memories Demand Unique Test Methods, Electronics, May 10, 1979, pp. 117-122.

*Primary Examiner*—Charles E. Atkinson
*Attorney, Agent, or Firm*—Gary C. Honeycutt; Richard L. Donaldson; Melvin Sharp

[57] ABSTRACT

Disclosed is a method and apparatus for digital implementation and closed loop feedback of magnetic field waveforms utilizing three channels of a four channel incrementally programmable voltage source to drive field coils in each of three spatial axes, respectively. A fourth channel is utilized for signal conditioning of an output signal from a magnetic bubble memory undergoing test by injecting inverted noise to maximize the signal-to-noise ratio.

14 Claims, 8 Drawing Figures

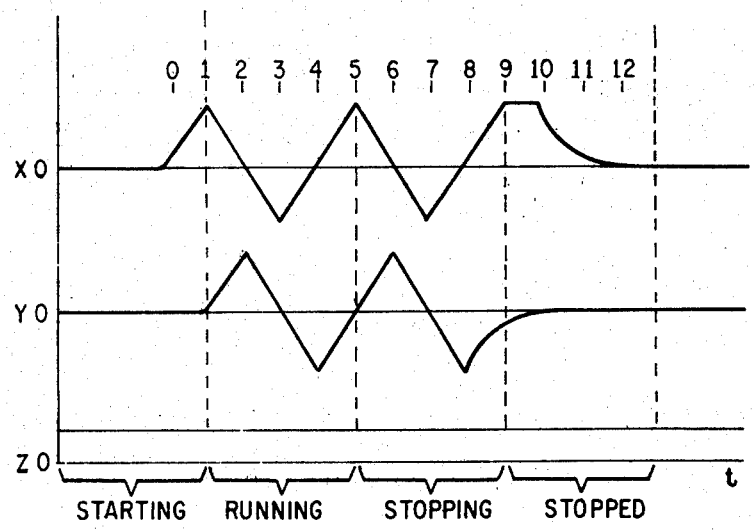
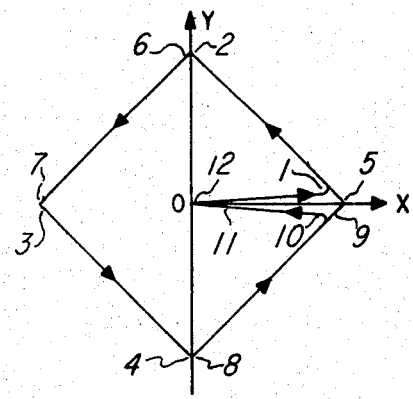
Fig.1

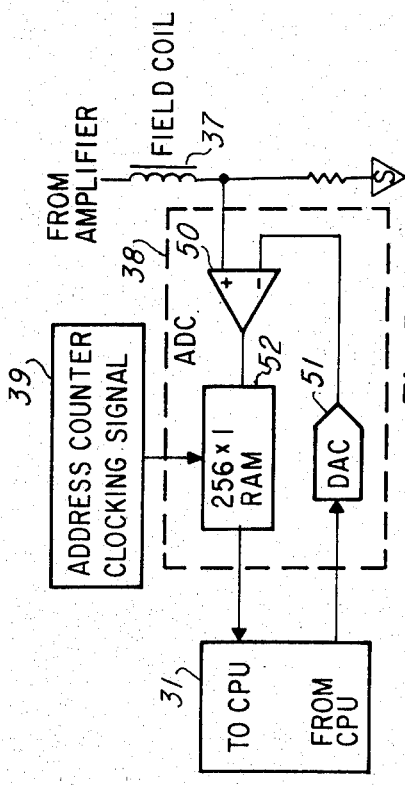
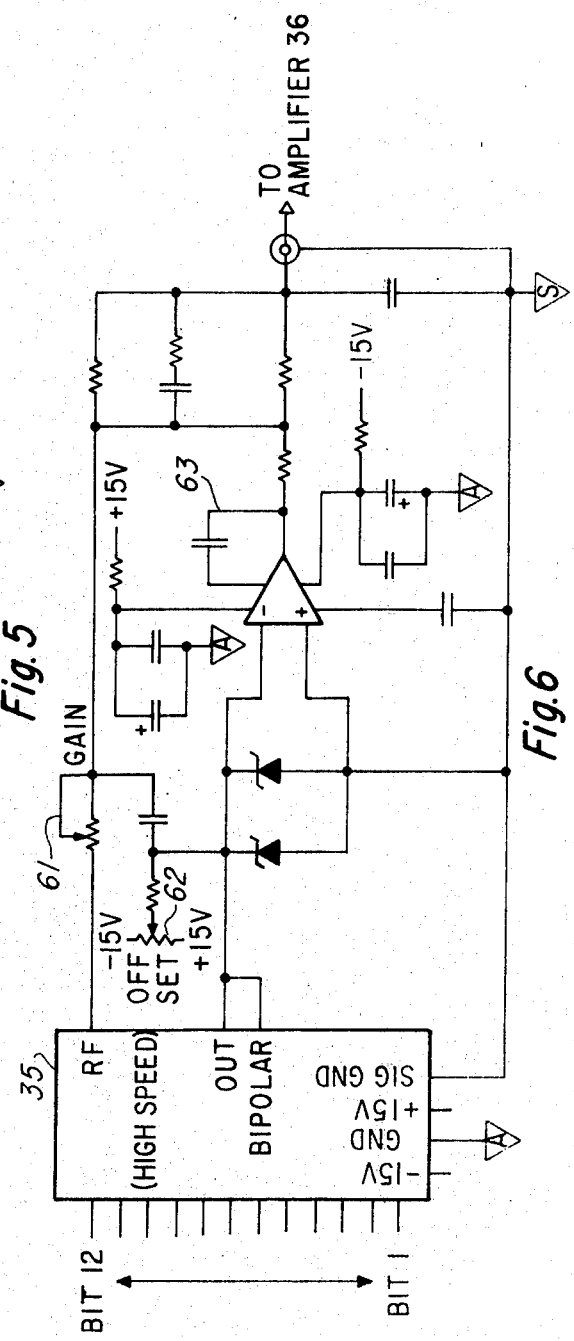

ARBITRARY DRIVE FOR MAGNETIC FIELD WAVEFORM CONTROL

BACKGROUND OF THE INVENTION

The characterization and testing of magnetic bubble memories plays an important role in all phases of magnetic bubble memory manufacturing. Commercially available magnetic bubble memories operate in a three dimensional magnetic field. The first field referred to as bias or Z field is required for the development and maintenance of the bubbles within the magnetic material. If the bias field is too strong, the bubbles will collapse. If the bias field is too weak, the bubbles will turn into a serpentine shaped domain. Therefore, the bias field must be operated at a level consistent with good bubble maintenance. This difference between the high field and low field is referred to as the bias margin and a good bias margin is required to operate a bubble memory device effectively. Additionally, a holding bias vector is required in the X-Y plane to prevent bubble migration during the standby or power down mode. This is accomplished either by a slight tilt of the chip in the Z field, or by the addition of holding bias coils to provide the required field.

The X and Y fields, respectively, are developed by applying an alternating current source to an X coil and a phase differentiated alternating current to a Y coil in such a manner so as to induce a magnetic field in the plane of the tested magnetic bubble memory device and as the frequency modulates the induced magnetic field of the X and Y coils the resultant magnetic vector in the plane of the test chip rotates at one revolution for each period of the applied signal to the coil. When the chip is at the probe stage or the first check of the slice itself, it is common practice to apply a sinusoidal drive current to both the X and Y coils primarily due to the large currents and voltages required since the coils must be large and located at some greater distance from the chip than is required in actual operation. Since these currents must be large to develop a uniform magnetic field across the surface of the chip a sinusoid is easier to maintain and is easier to control with respect to the changing magnetic fields and large currents required.

Once the device has been fabricated, however, many magnetic bubble memory users drive the chip utilizing a triangular or sawtooth wave because of its relative simplicity to generate on the magnetic bubble memory board and the smaller currents required in its final assembled form. This results in a discrepancy between those devices which pass probe operated in a sinusoid drive but will fail final tests operated at a triangular drive primarily due to the differences between the margins and the rotating vector as plotted on a X Y graph forming different shapes. A sinusoid will form a circle where a combination of triangular waves applied to the X and Y coils will form a diamond shape. This diamond shape may propagate without any difficulty. However, the replication, swap and other functions may not operate as well and therefore cause a failure at final test for an otherwise acceptable chip. Further compounding this problem is the high noise level of the probe environment requiring several techniques to eliminate as much background noise as possible. For example, see the Roman Kowalchuk article entitled "Bubble Memory Testing at Western Electric" at pages 70 and 71, 1979, IEEE Test Conference, Cherry Hill, N.J. Also see the David C. Chang and John E. Davies article entitled "Characterization and Testing of Magnetic Bubble Memories" also 1979, IEEE Test Conference, Cherry Hill, N.J., and see Steve Bisset, entitled "Development and Execution of Bubble Memory Test Sequences", 1979, IEEE Test Conference, Cherry Hill, N.J.

Accordingly, it is an objective of the present invention to provide a magnetic field waveform control apparatus capable of producing desired magnetic fields in one or more spatial axes closely corresponding to a desired waveform or set of waveforms.

It is a further objective of the present invention to provide an engineering tool by which varying electrical and magnetic waveforms can be applied to a device to test mathematical predictions of dynamic characteristics of magnetic bubble cell designs, propagation parameters, replication and other necessary circuit functions, as well as materials and fabrication technique variations with respect to operating margins and waveform requirements.

Another objective of the present invention is to provide a flexible probe tester for in depth analysis of each bubble chip with respect to closely simulated operating conditions to avoid unnecessary expenditures on marginal chips.

Another objective of the present invention is to provide a final product testing device for analyzing end product margins, as well as an advanced degree of quality and reliability control over the final product.

Another objective of the present invention is to provide a magnetic bubble memory device tester for use in incoming device testing as well as checking device parameters after their sale to provide a trouble shooting tool and device tester for original equipment manufacturers of memory equipment using magnetic bubble memories.

SUMMARY AND BRIEF DESCRIPTION OF THE INVENTION

Briefly in accordance with the present invention, a digitally programmable magnetic field drive system, utilizing closed loop feedback, develops a closely corresponding magnetic waveform to that which is programmed. The desired waveform is programmed into a digital computer. The computer operates on the set of programmed increments to produce a digital voltage waveform. This waveform, in turn, is converted into an analog voltage signal, amplified and applied to the coil. A resultant magnetic waveform is sampled incrementally and this set of samples is then converted into a digital format and compared to the desired waveform. The computer then operates on the compared values such that the digital voltage waveform generated next results in an actual waveform which more closely resembles the programmed waveform. This process is done in one, two or three spatial axes at the same time, and is repeated until a close approximation to the programmed waveform is developed.

In one embodiment, a new bubble memory probe tester and final device tester utilizes a digital computer with four distinct channels operating from a programmed level of current for the waveforms and at a specified frequency to provide an arbitrary drive field waveform having a peak amplitude of 90 oersteds. The waveform of the induced magnetic field is sampled incrementally and fed back to the computer so that the voltage driven amplifier is adjusted for the purpose of more closely generating the programmed waveform. In addition, a DC holding field in the X-Y plane can be electrically superimposed on the in plane rotating field to achieve stop/start bubble operation. The computer function is performed by a Texas Instruments 990/10 computer utilizing four channels simultaneously, however, any computer of similar capability will also work. Three channels provides X, Y and Z waveforms, respectively, the fourth channel is operated simultaneously as a noise detection and feedback channel to increase the signal-to-noise ratio of the device under test.

In one aspect of the invention, the desired waveform for the X drive coil is programmed in a digital format into the computer. This waveform is converted by a algorithm into a voltage waveform in a digital format and is presented at the output of the computer. This digital voltage waveform is then converted into an analog format, amplified and applied across the X drive coil. The current produced in the coil is analogous to the induced magnetic field and is sampled incrementally, converted from its analog form into a digital format and presented to the computer. The computer then compares the sampled current with the programmed current waveform and by the use of an appropriate algorithm, modifies the X voltage and presents the modified voltage again to the outputs for the X channel. The Y channel is similarly operated. The Z channel or bias field also has this capability of feedback and modification as the engineer may require. Examples and applications will be given in the detailed description below. The fourth channel is used for noise suppression by recording the noise at the output of the device with no signal output. This noise is then reinjected in inverted form into the output of the device so that the tester more readily identifies a bubble/no bubble condition as it occurs at the output. Other novel features, objects and advantages of the invention will be apparent upon reading the following detailed description of illustrative embodiments of the invention in conjunction with the drawings herein.

DETAILED DESCRIPTION OF THE DRAWINGS

The novel features believed to be characteristic of this invention are set forth in the appended claims. The invention itself, however, as well as other objects and advantages thereof may best be understood by reference to the following detailed description of illustrative embodiments when read in conjunction with the accompanying drawings in which:

FIG. 1 represents a typical series of waveforms used for the starting, running, stopping and stop functions. The X, Y and Z programmed waveforms are shown in the same relative time phase. Also shown in FIG. 1 is a depiction of a diamond waveform typically used in the invention.

FIG. 3 represents one channel of the above described four channel system.

FIG. 5 is an expanded block diagram view of the feedback analog to digital converter system utilizing sampled successive approximation with software control.

FIG. 6 is a circuit diagram showing the coupling circuitry between the high speed digital to analog converter and the amplifier used in channels X, Y and Z.

Figure 2:
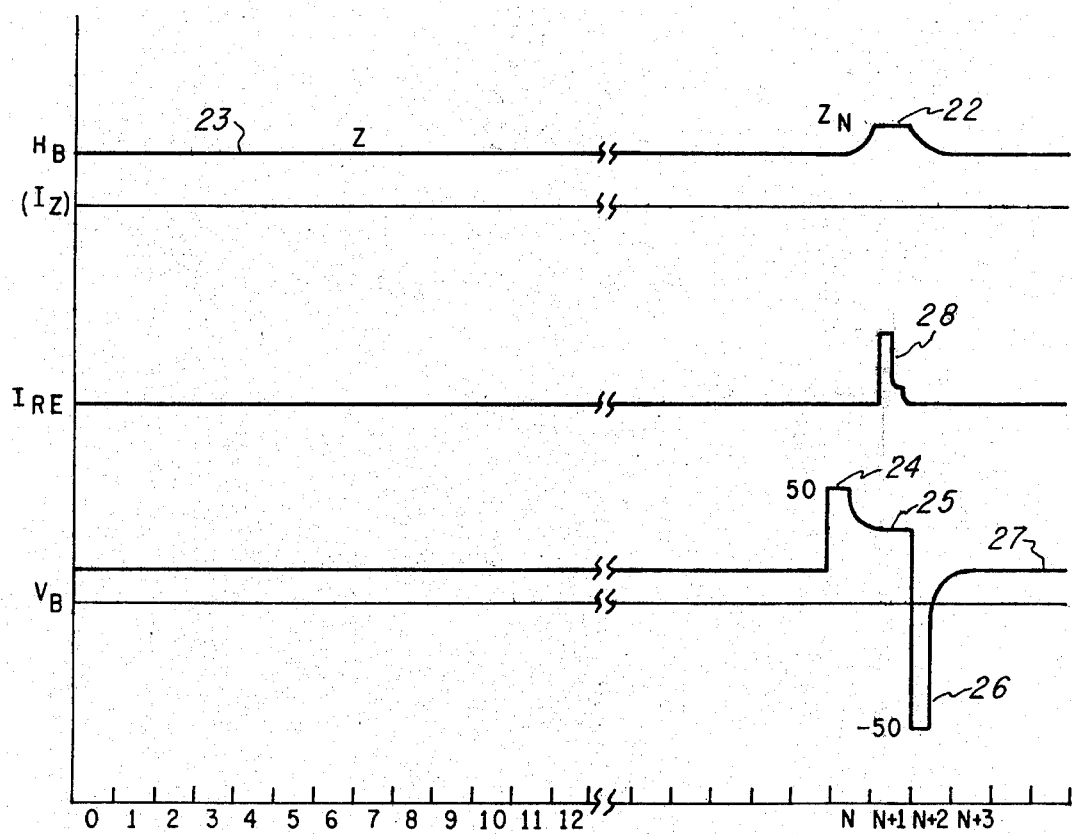
FIG. 2 is a representation of another example of an application of the present invention in which the applied voltage $V_B$ is shown relative to $H_B$ or the magnetic field as detected in the Z current and the subsequent modification of the bias magnetization.

Referring now to FIG. 1, the present invention is designed to have a full stop/start controllable function. To achieve this, the voltage source is arranged into four tables; starting, running, stopping, and stopped. Each table is then divided into 64 increments compatible with speeds and equipment readily available today. Other increment divisions are possible and may be desired in different applications with lower or higher frequencies, for example, or for greater or lesser control over the shape of the waveform. The X, Y and Z current waveforms shown in FIG. 1 are shown relative to each other, however, only one cycle is shown at each of the table waveforms. The starting function begins with the X current rising from 0 to 1 shown in the diamond form as coming from a 0 null position to the far right of the diamond. As the maximum X value is attained, the Y current is then turned on. As can be seen from the example, the Y current is held at 0 until the X current attains its maximum. This flexibility allows a more uniformly shaped diamond form. It should be noted that this example, while limited to a diamond form, is descriptive of a similar process used for attaining any resultant rotating vector shape which is required including variations in start/stop waveforms. Thus, the starting table originated at the computer has a 0 value for X up until a voltage is required at ¾ of the time required for one period of X; and Y is held at 0 for the entire starting table function.

Once the bubble propagation has begun and the starting has been accomplished the running phase is originated. A rotating resultant field shape is programmed into the computer such as a rotated diamond, a square, or a circle, or any combinations since each table is incrementally broken into 64 separate values. By programming different values for each of the 64 locations, each of the four table values may be adjusted to the designers required rotating resultant field pattern. Also, in FIG. 1, the Z field current is shown at a constant level. The rotating field can be adjusted to include a holding bias in any desired direction for the purpose of testing various function margins without interfering with the Z bias. This is accomplished by adding a slight value to each of the resultant vectors in such a way that the rotating field is shifted slightly around a point resulting in an effective Z bias holding pattern. This holding bias is generally required to prevent bubble migration during the stopped phase of the memory and can be simulated very simply by the use of this invention.

The stopping and stopped tables as shown in FIG. 1 are utilized to prevent over-shoot when the device is to be powered down. Magnetic bubble memories have the advantage of non-volatility in that the data stored will remain so long as the bias field is maintained within an acceptable operating margin. However, one problem has been observed in that when the current of the X and Y fields is brought to 0, very often an over-shoot will develop at point 9 as shown in FIG. 1. This is caused by the inductance of the coils themselves and is overcome by programming in the stopping and stopped tables a voltage sufficient to drive the current to null with no over-shoot. Experimentally, this is determined and applied very effectively with the present invention. Thus, the waveforms as shown in their relative positions represent four cycles of operation. Each cycle is broken into 64 increments, and those increments are programmed into the computer such that the current developed at the coils is representative of those current waveforms.

Referring now to FIG. 2, another example of the flexibility of the present invention is demonstrated. After having been started and being run for a number of cycles allowing the complete propagation around the respective loops of the tested device, it may be desirable, for example, to cause a replication function on the bubble chip. The bias margin of the replication function may be tested as shown in FIG. 2. The bias voltage applied to the Z coil is modified at a predetermined point in the cycles in such as manner so as to cause the current in the Z coil to increase to a higher level shown at 22, to maintain that higher current level during the replication phase and the application pulse is shown at 28. Then the current in the Z coil will be lowered back to its normal level shown at 23 by applying for example the waveform shown at 26 across the Z coil.

The waveforms shown in FIG. 2 are for illustrative purposes only. By proper application of a programmed voltage waveform across the coil, unwanted spikes or irregular current waveforms are avoided at the coil. The result is that the replication function of the chip may be tested at a higher bias than that normally required for propagation as in the example, or at a lower bias and thus a more accurate description of the capabilities of various functions of the devices may be obtained.

Figure 3:
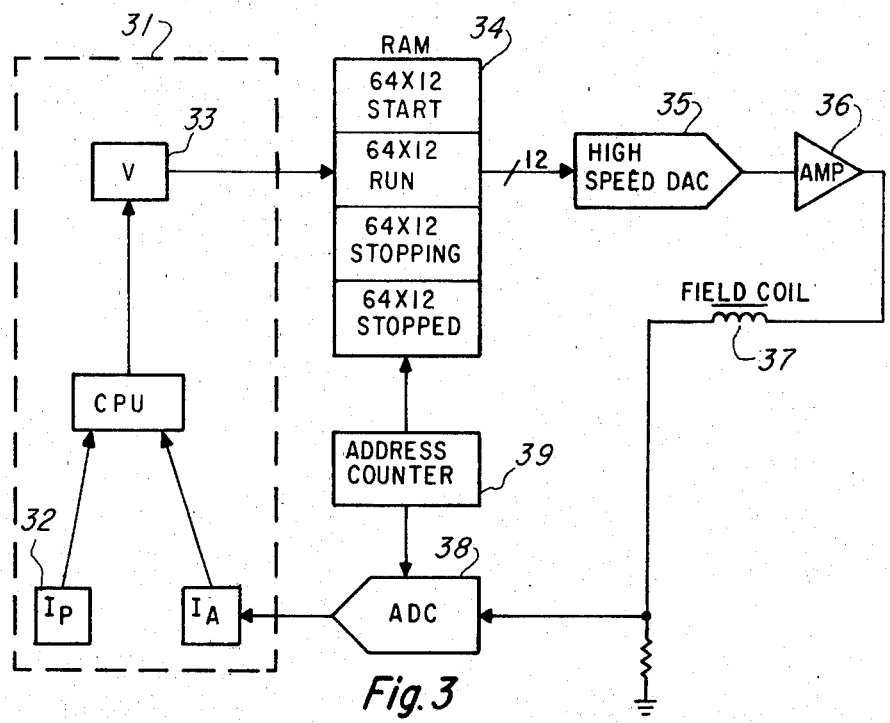
FIG. 3 is a block diagram representing the various components used in the present invention for the X, Y, and Z field functions.

Referring now to FIG. 3, the computer unit shown at 31 used is a Texas Instruments 990/10. The desired current values for channel X, for example, are programmed into the computer shown at 32, are calculated through an appropriate algorithm and converted into voltage requirements at 33. These voltage levels are presented to a RAM capable of holding the 12 bit×64 increment voltage signals in each of the four tables required for proper bubble function. This RAM shown at 34 is shown with these start, run, stopping, and stopped tables expanded. This in turn is connected to a high speed digital to analog converter shown at 35. That analog signal then is coupled into a coil driving amplifier nominally producing plus or minus 50 volts at 35 amps with a frequency capability of 0 to 4 MHz. The analog voltage is then presented across the field coil 37 and an induced magnetic field results. This magnetic field is directly analogous to the current in the coil and can thus be sampled as an accurate representative of the induced magnetic field. The sample is taken at 38 and converted back into a digital signal and presented to the computer unit for comparison with the program value. The address counter 39 is used to keep the RAM 34 and the analog to digital converter 38 as well as electrical stimuli to the device under test in phase and is operated in such a manner that the drive field coil, as well as the bias coil and noise suppression systems, are operated at 100 KHz.

FIG. 3 represents one channel of the three channels used to develop the induced magnetic fields. The X and Y channels are substantially identical as shown in FIG. 3. The Z channel is similar, however, Z channel table switching is programmable to occur a certain number of cycles after start. X and Y channel table switching is fixed in its sequence. That is, start, several running, one stopping and one stopped.

Figure 4:
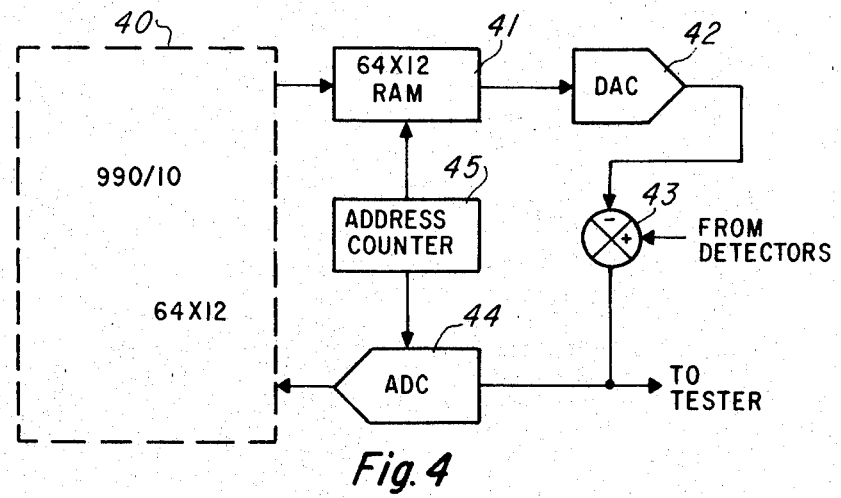
FIG. 4 is a block diagram depiction of the S channel which is included as one of the four channels in the present invention used for the suppression of noise.

Referring now to FIG. 4, the computer unit shown at 40 is connected to a 64×12 bit RAM shown at 41. The original signal programmed in for noise suppression is 0. This digital information is inputted into the digital to analog converter at 42, subtracted at 43 from the signal presented at the output of the tested device in a no output condition. This resultant waveform is fed both to the bubble detection testing apparatus, not shown, and to an analog to digital converter shown at 44. Both the analog digital converter 44 and the 64×12 RAM at 41 are coupled to an address counter 45 to maintain the proper phase. The signal from the analog to digital converter is then presented to the computing unit and is processed through an appropriate algorithm and an inverted form is presented to the RAM in such a manner as to drive the tested signal added to that from the digital to analog converter 42 to as near a null signal as may be attained. This process is limited in that the 64 increments in which the signal is tested will only suppress noise that is harmonic in form with that of the rotating field and of a relative low frequency. Frequencies higher than $\frac{1}{2} \times 64$ times the operating frequency cannot be suppressed in this manner. However, they can be readily filtered through the use of known capacitive means.

Referring now to FIG. 5, the analog to digital converter is shown as used for the X, Y Z and S channels. The clocking signal 39 is presented to the analog to digital converter at a 256×1 random access memory 52. A zero voltage condition from computer 31 is presented to the digital to analog converter 51 and in an analog format is compared against the sampled signal at comparator 50 from the field coil 37. This comparison signal is clocked at the operating frequency by the timing unit shown at 39 such that the RAM incrementally takes a signal and presents that information to the CPU. It can be seen that the clocking signal 39 operating RAM 52 is in phase with the signal from the CPU 31 and thus the sample signal will be at the same address count as the applied voltage signal from the CPU. This feedback circuitry is controlled by a software modifiable program such as shown in FIG. 8.

Referring now to FIG. 6, a high speed digital to analog converter shown at 35 has a 12 bit signal applied from the RAM 34 as generated by the CPU. This voltage signal is converted from its digital format into analog form and through circuitry shown in FIG. 6 is presented to amplifier 36 as shown in FIG. 3. Potentiometer 61 is a gain adjustment for controlling the output level of the analog voltage signal. Potentiometer 62 and variable capacitor 63 are used to calibrate offset voltage and high frequency compensation, respectively.

Figure 7:
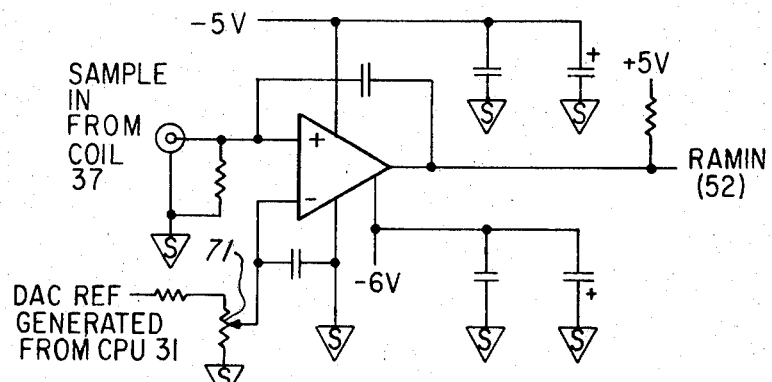
FIG. 7 is a circuit diagram showing the circuitry surrounding the comparator aspect of the analog to digital feedback process.

Referring now to FIG. 7, the feedback comparator circuitry is shown where the sampled analog current from coil 37 as shown in FIG. 5 is processed through the circuitry shown in FIG. 7 and compared with the analog signal from the digital to analog converter reference signal generated from the CPU. FIG. 5 shows the relative positions of the circuitry in FIG. 7 as related to the entire feedback circuit and also shows the digital to analog converter 51. This is a relatively low speed digital to analog converter and is used for feedback from the CPU only. Potentiometer 71 as shown in FIG. 7 is used for conversion gain calibration.

Figure 8:
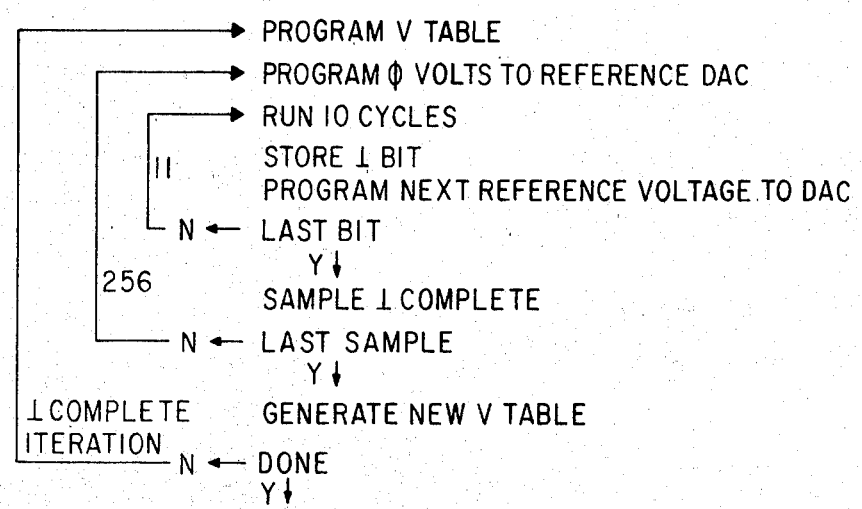
FIG. 8 is a suggested program structure for the purpose of attaining a sampled successive approximation in the feedback loop.

Referring now to FIG. 8, an example is shown of a sampled successive approximation loop diagram used in the software control of the feedback circuitry. After programming the desired current waveform into the CPU, this current waveform is processed through an algorithm, for example, $V_K(N) = V_{K-1}(N) + C[I_P(N+4) - I_A(N+4)]$ where VK is any given voltage output at the CPU for the N bit location; $V_{K-1}$ is the previous voltage programmed from the CPU for that location; $I_P(N+4)$ is the programmed current for the N+4 position and $I_A(N+4)$ is the actual current detected from the feedback circuitry. The factor C multiplied times the current value is a control factor to avoid too rapid of a convergence process and thus overdriving the amplifier and coil circuitry. The currents as used in the algorithm are four bits ahead of the voltage signal due to lag induced by circuit delays and by the inductance in the coil. The coil retards the current build-up, while the voltage is applied due to the induced magnetic field in counteracting inductance. This algorithm is given as an example only and as the engineer may require can be modified to specific requirements. Thereafter, programming the current required, the CPU calculates the voltage table for four tables and each of those four tables contains 64 increments of applied voltage. Then the program is initiated with 0 volts applied to the reference digital analog converter in the feedback circuitry. At this point, the start table is initiated, the voltages are brought up to operating frequencies, and a given number of cycles are run, operating the coils in the drive field as well as bias. The sample circuitry is directed by the address counter to store one bit of sampled information. This bit is compared by the comparator and related back to the CPU. The program compares that sample current with the reference current and one bit is then stored. If there is a difference between the two, as will be most often the case, this process is repeated again; starting, running, stopping, and stopped and the first count of the 64 increment starting waveform is again sampled. This process is repeated eleven times and each time the reference DAC is programmed to more closely approximate that value in form. This results in an successive approximation of the sampled current and provides the actual current sample in a bit format for the CPU. When the twelfth bit has been sampled and stored, the process is initiated once more, this time sampling the second of the 64 counts in the starting waveform. This bit is successively approximated in twelve loops obtaining twelve bits of information for the CPU before going to the third count of the 64 in the starting waveform. This process or larger loop is repeated 256 times, which corresponds to one twelve loop cycle for each of the 64 counts in each of the starting, running, stopping and stopped waveforms. Note that the starting, stopping and stopped waveforms are only run once each in a start/stop sequence, however, the running cycle will be normally cycled many times, 10 in the example. The sample is taken at the last running waveform to insure the system is completely settled.

Upon completion of collecting and storing the actual current observed in a digital format in the CPU and the last count of the 64 counts in the stopped waveform has been completed, the CPU then operates on the actual current and the programmed current through the utilization of the suggested algorithm previously given to generate a new voltage table for the CPU. This loop, once completed, is termed one iteration and thereafter the voltage presented to the high speed digital to analog converter will be the new voltage tables generated in the above loops.

In actual time operation one iteration is completed in about six to ten seconds corresponding to an operating frequency of 100 KHz on the drive field. This process can be done on the X, Y or Z channels independently, or all three may be converged in this manner at the same time. The entire iteration process will take from thirty minutes to as long as four hours to develop an accurately reproducible waveform across the drive field corresponding to the programmed current waveform. The time required for the completion of the iterations is a direct corresponding relationship to the factor C as shown in the suggested algorithm. It is important here to note that the voltages and currents produced by the amplifier across the drive and bias fields are very high relative to the machinery involved at plus or minus 50 volts at 35 amps. The convergence factor C should be a conservative figure such that the voltages and currents are not too radically modified during the initial iterations of the program. The consequence of excessively fast convergence will be to cause the amplifier to invoke its overcurrent shutdown safeguards.

The signal conditioning channel is operated in a similar fashion, however, a voltage signal is sampled from the output of a device with no bubbles present and is recorded. This recorded signal is then inverted and applied to the output signal in such a manner as to reduce the periodic noise. The noise which may be observed in a normal probe environment will be drive field induced noise on the magnetic bubble memory detector circuitry, noise induced in the probe needles due to the rotating field capacitive and magnetic (mutual inductance) coupling between the drive coils and probe needles, and between the drive coils and the detector elements. Thus, this circuitry has the capability of reducing the noise induced by the magnetic coupling of the detector and needles, as well as electric coupling between the winding and the needles. A negative noise feedback and injection circuit for the purpose of noise suppression is well known to those skilled in the prior art. However, the simultaneous operation of noise circuitry together with the arbitrary drive aspects of this invention is readily achieved with respect to the circuitry and techniques used in this invention.

In actual operation, the operator creates a set of programmed current values and programs them into the CPU. He then begins the iteration process in a converging manner lasting as stated before from thirty minutes to approximately four hours. Once this iteration process is completed, the final voltage values can be dismounted from the computer in a tape format and thereafter iteration is no longer necessary for the application of that waveform to that particular machine and set of equipment. It should be noted that the feedback process will take into account any non-linearities present in the digital to analog converter stage, amplifier or coil equipment. Thus, if any of these items are exchanged or switched with other comparable equipment, the iteration process should be begun anew to bring the waveform into line with that which is programmed. It is also possible on a periodic basis, such as weekly or biweekly, to go to a smaller iteration process to compensate for any non linearities or gain and offset drift which may develop in the equipment while it is being used after the iteration process. While the preferred embodiment utilizes an iteration process that includes a recording stage and subsequent playback, continuous and real-time iteration and concurrent modification control is possible as well. This is true as well of the signal conditioning channel, which will be operated normally in its recording mode approximately once a day to accomplish a more accurate noise suppression. While prior art techniques, such as differential amplification and capacitive filtering are capable of producing a signal-to-noise ratio of 5 to 1 in a conventional manner, the disclosed signal-to-noise ratio suppression circuitry is capable of accomplishing a 20 to 1 signal-to-noise ratio. This improvement enables the engineer to observe the tested devices at a much higher level of analysis and increases considerably the ability to objectively test each magnetic bubble memory. Since the signal conditioning circuitry does not require the large voltage and current amplification of the drive fields, the convergence is very much more rapid and can be completed in approximately ten iterations. Thus, the entire iteration process used for signal-to-noise ratio enhancement will take approximately two to five minutes including program initiation and termination. Although the example given is a probe test machine, it can be readily seen that this apparatus is also capable of testing final devices with only minor modifications obvious to those skilled in the prior art. Additionally, this machine is useful in subsequent testing of finished devices, as well as analyzing device parameters with respect to different bubble memory user's equipment in consideration of the drive fields that may be applied to the chips.

The present invention has a broad applicability to many areas and although a complete listing of other possible uses would be very lengthy, any technology using induced magnetic fields in one, two or three spatial axes may benefit from the application of the disclosed invention. For example, 1. Digital deflection currents in radar screen and other cathode ray tubes;
2. Control of ionized paths in particle beams and in accelerators;
3. Magnetohydrodynamic generation and processes;
4. Ionized plasma control in nuclear processes;
5. Molecular beam control for deposition of precise patterns without requiring masking on integrated circuits;
6. Digital control of linear and other electrical motors for efficiency improvements and precise waveform adjustments;
7. Precision force transducers as, for example, a force table used for quality control testing.
8. Magnetic recording equipment where the medium and head are optimized utilizing closed loop feedback.
9. Digital application to generator field coils to compensate for non-uniformities, thereby improving efficiency.
10. Hall Effect device testing similar to the preferred embodiment of a magnetic bubble memory tester.
11. Magnetic bearings and servomechanisms utilizing digital closed loop feedback for precision and efficiency.

While the present invention has been described in detail with respect to the description of various embodiments, it will be apparent to those skilled in the art that modification may be made without departing from the scope and spirit of the present invention.

What is claimed is:

1. An apparatus for controlling magnetic fields in one or more spatial axes comprising:
   (a) means for inducing magnetic fields in one or more spatial axes;
   (b) means for controlling said induced magnetic fields utilizing a set of programmed increments in digital format;
   (c) means for sensing said induced magnetic fields; and
   (d) means connected to said means for controlling and to said means for sensing said induced magnetic fields for modifying said induced magnetic fields in a closed loop feedback system such that said sensed magnetic fields are made to more closely resemble said set of programmed increments.

2. An apparatus as in claim 1 wherein said means for controlling the induced magnetic fields is comprised of a programmable digital computer system utilizing three channels of a multiple channel network to control the magnetic field of each of the three spatial axes independently of the others.

3. An apparatus as in claim 2 wherein said means for controlling said induced magnetic field includes:
   (a) means for sampling each field coil current;
   (b) means for comparing said current to a programmed set of waveform values; and
   (c) means for modifying said sampled current to more closely resemble said programmed set of waveform values.

4. An apparatus as in claim 2 wherein said means for controlling said induced magnetic field is comprised of a software programmable analog-to-digital converter interconnected between a field coil current sensing device and said programmable digital computer system.

5. A method for controlling magnetic fields in one or more spatial axes comprised of the steps of:
   (a) programming a desired current waveform into a digital computer;
   (b) converting said current waveform into an analog voltage waveform;
   (c) amplifying said analog voltage waveform and applying it across a field coil, said coil developing an induced magnetic field corresponding to the resultant analog current waveform;
   (d) sampling said analog current waveform incrementally;
   (e) comparing said samples with said programmed current waveform; and
   (f) adjusting said analog voltage waveform with respect to said comparing step for the purpose of causing said sampled waveform to more nearly approximate said programmed waveform.

6. A method as in claim 5 including the step of operating a signal conditioning feedback circuit, said circuit operable to provide incremental sampling of an output signal from a magnetic bubble memory device undergoing test, for the purpose of detecting noise therein, and adding said noise in an inverted form to said signal.

7. A method as in claim 6 wherein the step of operating a signal conditioning feedback circuit is included the steps of:
   (a) sampling a signal from a magnetic bubble memory device undergoing test and detecting noise therein;

(b) inverting said detected noise in an incremental format; and (c) adding said inverted noise to said signal at an adjustable rate for the purpose of increasing the signal to noise ratio in said signal.

8. A method as in claim 5 wherein said step of converting a programmed waveform into an analog voltage waveform is comprised of utilizing three channels of a multiple channel digital computer system to incrementally control the magnetic field of each of three spatial axes independently of the others.

9. A method as in claim 8 wherein the step of converting a programmed waveform includes the steps of:
(a) sampling each field coil current;
(b) comparing said current to the programmed current waveform value; and
(c) modifying said sampled current to more closely resemble said programmed current waveform value.

10. A method as in claim 8 wherein the step of converting a programmed waveform includes the step of utilizing a software programmable analog-to-digital converter interconnected between a field coil current sensing device and said programmable digital computer system.

11. A magnetic bubble memory testing method comprising the steps of:
(a) programming a desired waveform into a multichannel digital computer;
(b) converting signals from said computer into analog waveforms;
(c) amplifying said analog waveforms;
(d) converting said analog waveforms into magnetic fields;
(e) sensing said magnetic fields and providing feedback to said digital computer;
(f) improving an output signal from a magnetic bubble memory undergoing test utilizing one channel of said multichannel digital computer; and
(g) controlling the timing of the above steps with respect to the various channels and functions.

12. A method as in claim 11 further including the step of switching programmed current waveforms in one or more channels independently of the other channels.

13. A magnetic bubble memory testing apparatus comprising:
(a) a multichannel digital computer;
(b) means for converting a series of digital signals into analog waveforms;
(c) means for amplifying said analog waveforms;
(d) means for converting said waveforms into magnetic fields;
(e) means for sensing said magnetic fields and providing feedback to said digital computer;
(f) a magnetic bubble memory undergoing test in magnetic communication with said magnetic fields to produce an output signal;
(g) means for improving said output signal from said magnetic bubble memory utilizing one channel of said multichannel digital computer; and
(h) means for interconnection and timing control of said apparatus.

14. Apparatus as in claim 13 further including means connected to said means for converting to provide a selected one of a plurality of series of digital signals thereto.

* * * * *